Sept. 17, 1963 J. J. TIEMANN 3,104,352
VOLTAGE REGULATOR EMPLOYING A NARROW JUNCTION
DEGENERATE SEMICONDUCTOR DIODE
Filed Dec. 24, 1959 2 Sheets-Sheet 1

Inventor:
Jerome J. Tiemann,
by John F. Ahern
His Attorney.

Sept. 17, 1963 J. J. TIEMANN 3,104,352

VOLTAGE REGULATOR EMPLOYING A NARROW JUNCTION DEGENERATE SEMICONDUCTOR DIODE

Filed Dec. 24, 1959 2 Sheets-Sheet 2

Inventor:
Jerome J. Tiemann,
by John F. Ahern
His Attorney.

United States Patent Office 3,104,352

Patented Sept. 17, 1963

3,104,352

VOLTAGE REGULATOR EMPLOYING A NARROW JUNCTION DEGENERATE SEMICONDUCTOR DIODE

Jerome J. Tiemann, Burnt Hills, N.Y., assignor to General Electric Company, a corporation of New York Filed Dec. 24, 1959, Ser. No. 861,870
8 Claims. (Cl. 321—47)

This invention relates to voltage regulators and in particular to such regulators using semiconductor devices.

The semiconductor device used in this invention is a narrow junction degenerate semiconductor diode. Such a device exhibits a peak current and a negative resistance characteristic at low forward voltages. "Peak current" as used herein refers to the highest value of current just before the negative resistance region of the current-voltage characteristic of the device.

In order for a semiconductor diode to exhibit such a characteristic it must be impregnated with a significant impurity on both the P-type and N-type side with an excess concentration sufficiently high to make the device degenerate. By a "degenerate semiconductor" is meant a body of semiconductor to which has been added sufficient excess donor impurity so that the Fermi-level for electrons is higher in energy than the conduction band edge; or to which has been added sufficient excess acceptor impurity so that the Fermi-level has been depressed to a lower energy than the valence band edge.

As used herein a narrow junction semiconductor device refers to a semiconductor device having excess donor and acceptor concentrations on either side of the junction respectively so that both the N-type side and the P-type side of the junction are degenerate. Such a device exhibits a negative resistance characteristic at low forward voltages.

The narrow junction degenerate semiconductor diode used by this invention exhibits a negative resistance characteristic in the forward voltage range of less than one volt. For example, the range of the negative resistance characteristic for a germanium device is from about .04 to 0.3 volt while for a silicon device the range is from about .08 to 0.4 volt.

For further details concerning the semiconductor device utilized in this invention reference may be had to the copending application of Tiemann, Serial No. 858,995, filed December 11, 1959, assigned to the assignee of the present application, and now abandoned in favor of the continuation-in-part application of Tiemann, Serial No. 74,815, filed December 9, 1960, assigned to the assignee of the present application.

It is an object of this invention to provide an alternating current-voltage regulator using a narrow junction degenerate semiconductor diode.

It is another object of this invention to provide a system for producing a control signal which depends upon the deviation of the peak-to-peak alternating voltage from a predetermined value.

It is a further object of this invention to provide a voltage regulator which allows for a substantial reduction in circuit components.

It is still another object of this invention to provide a voltage regulator sensing circuit which is extremely sensitive and stable.

Briefly stated, in accord with one aspect of this invention the voltage regulator is utilized in connection with an alternating current voltage source which is subject to variations in amplitude. A narrow junction degenerate semiconductor diode, having a predetermined peak current and a negative resistance characteristic at low forward voltage, is connected in circuit with the voltage source and a bias means. Means are provided for modulating the alternating voltage such that at a preselected value of voltage, the peak current of the diode is exceeded at a definite time during each modulation cycle. The peak current of the diode, therefore, will be exceeded a different time during each modulation cycle depending upon the deviation in amplitude of the alternating voltage from a selected threshold value. Since that portion of the current-voltage characteristic of the diode corresponding to higher voltages than those in the negative resistance region is much more non-linear than that portion corresponding to voltages lower than those in the negative resistance region there is a change in the rectification of the alternating current when the peak current of the diode is exceeded and switching occurs. This change in rectification of the alternating current results in a large direct current output at the diode. This provides an output signal at the diode which depends upon the deviation of the peak-to-peak value of the regulated alternating current voltage. This signal output may be utilized in a variety of conventional ways to correct the amplitude of the alternating current voltage to the selected threshold value.

For a better understanding of the present invention, together with other and further objects thereof, reference is had to the following description taken in connection with the accompanying drawings and its scope will be apparent from the appended claims.

Figure 1:
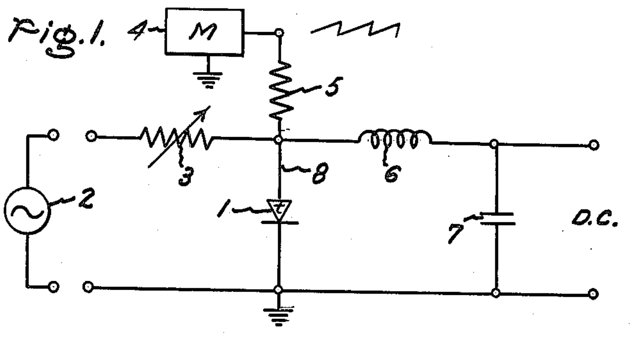
FIG. 1 is a schematic illustration of one embodiment of this invention.

The voltage regulator sensing circuit of FIG. 1 utilizes the discontinuous change in the rectifying properties of narrow junction semiconductor diode 1 to provide a continuously variable control signal which depends upon the deviation of the peak-to-peak voltage, which is sensed by the system of the invention, from a selected threshold value.

Diode 1 is connected to alternating current voltage source 2 through variable resistor 3. Resistor 3 serves to limit the current to the diode and provides for an appropriate threshold level. Means are provided for impressing a slowly varying wave form or a direct current-voltage on the alternating voltage. This may be accomplished in any conventional manner and may be, for example, by modulator 4. Modulator 4 impresses a preselected voltage, as for example, a triangular wave, on diode 1 by connection through an appropriate impedance such as resistor 5. A filter, including inductor 6 and capacitor 7 in series combination, is connected from diode electrode 8 to the other side of the applied voltage source.

The above are the only components required for this novel voltage regulator sensing circuit.

Figure 2:
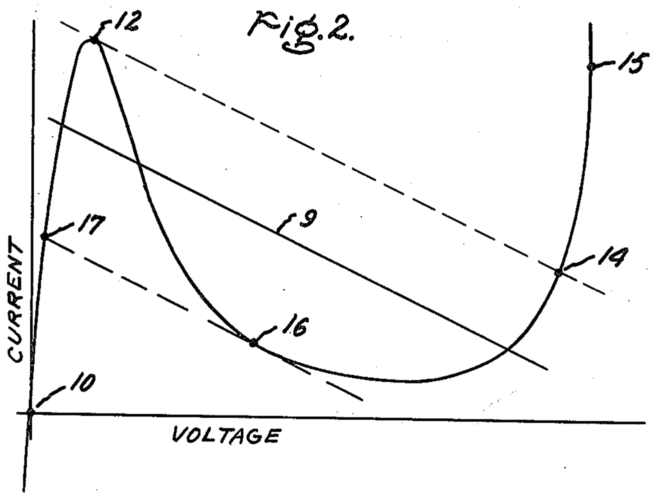
FIGS. 2 and 3 are current-voltage characteristics of a semiconductor diode device which can be used in practicing this invention.

Having set forth the circuit configuration its operation may now be considered. Referring now to FIG. 2 there is shown a current-voltage characteristic of a device suitable for use in circuits constructed in accord with this invention. A brief analysis of FIG. 2 will illustrate the switching action of the device.

Assume initially that the device is in a circuit having a load impedance which causes a load line 9, or one parallel thereto, to govern its operation. If an applied direct current voltage is gradually raised from zero, the operating point of diode 1 moves along the current-voltage characteristic in the region 10—12. When the operating point is at 12, however, an infinitesimal further increase of voltage causes the operating point to shift abruptly to the point 14 with the attendant decrease in current. A further increase of supply voltage causes the operating point to move toward 15. If the supply voltage is now decreased gradually the operating point moves along the region 15—16 of the current-voltage characteristic until the point 16 is reached from where it jumps abruptly to point 17 with the attendant increase in current. By choosing an appropriate load line, whenever the voltage is such that the operating point moves to an unstable position of the characteristic the device can be made to switch instantaneously to another stable operating point as determined by the slope of the load line.

Figure 3:
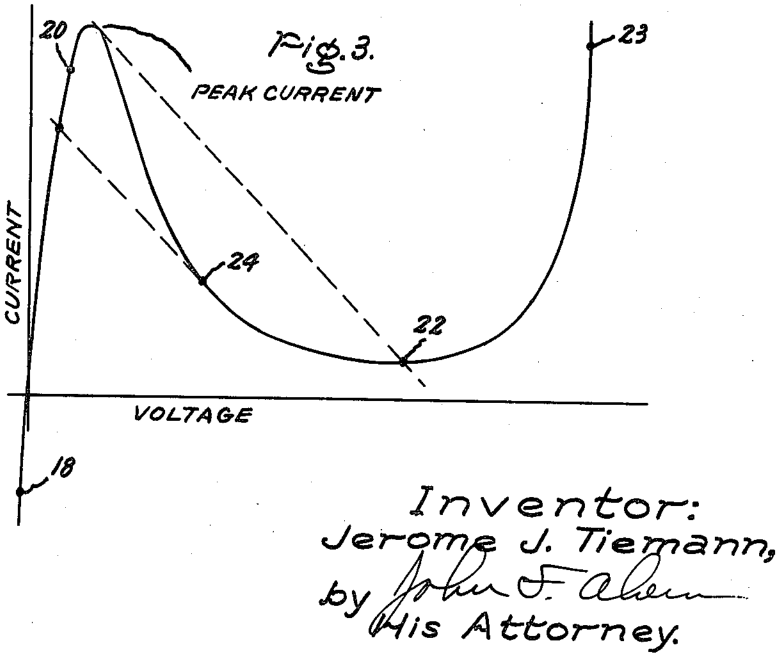

Further characteristics of the invention will become apparent from a consideration of FIG. 3. Assume that diode 1 is now operated in connection with an alternating current voltage source. Means are provided to bias the diode such that during each cycle of the alternating voltage the path of operation will be maintained on the portion 18—20 of the current-voltage characteristic.

Figure 4:
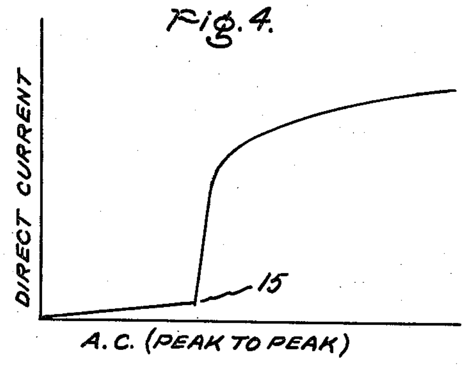
FIG. 4 is a curve illustrating the direct current output of the semiconductor diode with respect to the peak-to-peak alternating voltage.

This branch of the characteristic is only slightly non-linear so very little rectification of the alternating current results and there is only a very small direct current output at the diode. If the alternating current voltage is increased in value, however, such that the peak current of the diode is exceeded, switching occurs and the operating point moves along region 23—24 for a time depending upon the amplitude of the alternating voltage. That is, if after switching the voltage is still increasing the operating point will move upward from point 22 toward 23 until the maximum positive voltage peak has been reached and then moves back along the curve until approximately point 24 when it again instantaneously switches to the branch 18—20 and completes the cycle. There is a discontinuous change in the rectifying properties due to this switching and the operation over the more non-linear branch 23—24 of the current-voltage characteristic. Because of this greater non-linearity there is a large direct current output at the diode. FIG. 4 shows the direct current output with respect to the peak-to-peak alternating current with the discontinuity shown at 15.

Figure 5:
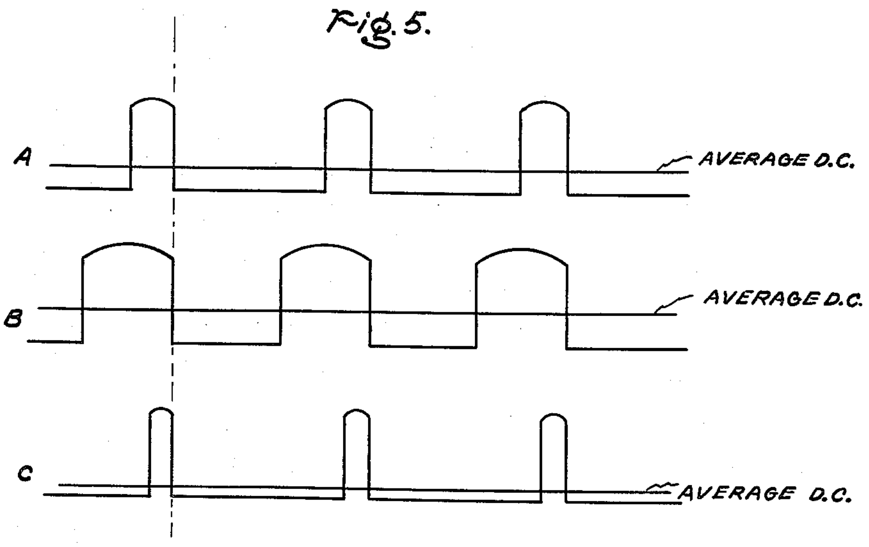
FIG. 5 is a graphical representation of voltage output wave forms at the diode illustrating the change in the time average direct current output with deviation in the peak-to-peak alternating current voltage from a selected threshold value.

The voltage regulator sensing circuit utilizes this discontinuity and change in rectifying properties of the diode to provide a very stable and sensitive means of producing a continuously variable control signal. As shown in FIG. 4 when the alternating current peak-to-peak voltage is in the range of discontinuity a very small change in the peak-to-peak value produces a large change in the direct current output. An alternating current-voltage source which may be subject to variations in amplitude is modulated, such as by a triangular or saw tooth wave, or by a direct current. The average direct current output of the diode is then between the two extremes which were obtained using the unmodulated alternating current-voltage source. The peak current of the diode is exceeded at a definite time during each modulation cycle and a predetermined direct current output is available at the diode depending upon the value of the peak-to-peak alternating current. This value of the alternating current voltage is referred to herein as the "threshold voltage." The output signal, therefore, for a particular threshold voltage is as shown graphically by the voltage wave forms A of FIG. 5 with the time average direct current being as indicated.

As the peak-to-peak alternating voltage deviates from the threshold value the operation is such that the peak current of the diode is exceeded either at an earlier or a later time depending upon whether the voltage increases or decreases respectively. Wave forms for the case where the voltage is higher than the threshold value are such as shown at B of FIG. 5 with the time average direct current output again being as indicated and showing its increase in value due to the longer period of operation on the non-linear branch of the current-voltage characteristic. A corresponding decrease in the output results from a decrease in the alternating voltage from the threshold value. A wave form for such a case is as shown at C of FIG. 5.

The output signal at the diode, therefore, is continuously variable and depends upon the deviation of the peak-to-peak alternating voltage from a selected threshold value. The control signal thus developed may be utilized in any conventional manner to correct the voltage source to the selected threshold value. The control signal can thus be utilized to regulate a varying alternating current-voltage to a selected value. The signal may further be utilized in a variety of control circuits known in the art.

While only certain preferred features of the invention have been shown by way of illustration many modifications will occur to those skilled in the art and it is, therefore, to be understood that the appended claims are intended to cover all such modifications as fall within the true spirit and scope of this invention.

What I claim as new and desire to secure by Letters Patent of the United States is:

1. A voltage regulator sensing circuit comprising: a narrow junction degenerate semiconductor diode device having a predetermined peak current and exhibiting a negative resistance region in the low forward voltage range of its current-voltage characteristic; means for coupling said diode device to a source of alternating current voltage to be maintained at a selected level; means coupled to said diode device for amplitude modulating the alternating current voltage applied thereto so that the selected voltage level of said alternating current voltage source the peak current of said diode device is exceeded only for a predetermined period during each modulation cycle to develop a direct current voltage output signal across said diode device which depends in value upon the peak-to-peak deviation from the selected level of said alternating current voltage source.

2. A circuit for providing a continuously variable voltage signal output which depends upon the peak-to-peak deviation of an alternating current voltage supply from a selected value comprising: a narrow junction degenerate semiconductor diode device having a predetermined peak current value and exhibiting a negative resistance region in the low forward voltage range of its current-voltage characteristic; means for coupling said diode device to a source of alternating current voltage subject to variations in amplitude from a selected level; means coupled to said diode device for amplitude modulating the alternating current voltage applied thereto so that the peak current of said diode device is exceeded at a definite time during each modulation cycle for an alternating current voltage corresponding to said selected value and at a different time during each modulation cycle for alternating current voltage values differing from said selected value to produce across said diode device a continuously variable direct current output which depends upon the deviation of said alternating current supply voltage from said selected value; and means for extracting said direct current output.

3. In combination with an alternating current voltage source which is subject to variations in amplitude from a selected level: a narrow junction degenerate semiconductor diode device having a predetermined peak current and exhibiting a negative resistance region in the low forward voltage range of its current-voltage characteristic; means coupling said voltage source to said diode device to cause current flow therein; means coupled to said diode device for amplitude modulating the alternating current voltage applied thereto to cause the peak current of said diode device to be exceeded during a portion of each modulation cycle; means in circuit with said diode device and said voltage source for determining the point during each modulation cycle at which said peak current is exceeded when said voltage source is at said selected level to develop a direct current output across said diode device whose value depends upon the peak-to-peak deviation in the amplitude of said alternating current voltage source from said selected level; and means for extracting said direct current output.

4. In combination with an alternating current voltage supply which is subject to variation in amplitude from a selected voltage level: a narrow junction degenerate semiconductor diode device having a predetermined peak current value and exhibiting a negative resistance region in the low forward voltage range of its current-voltage characteristic; a resistance, said resistance and said diode device being connected to form a series circuit; means for coupling said circuit to said alternating current voltage supply to cause current flow in said circuit; and means coupled to said diode device for amplitude modulating the alternating current voltage applied thereto to produce a direct current output across said diode device whose value depends upon the peak-to-peak deviation of the alternating current voltage supply from said selected voltage level.

5. A combination with an alternating current voltage supply which is subject to variations in amplitude from a selected voltage level: a narrow junction degenerate semiconductor diode device having a predetermined peak current and exhibiting a negative resistance region in the low forward voltage range of its current-voltage characteristic; means for coupling said diode device to said alternating current voltage supply; modulation means coupled to said diode device for amplitude modulating the alternating current voltage applied to said diode device; and means in series circuit between said alternating current voltage supply and said diode device controlling the point during each modulation cycle at which the peak current of said diode device is exceeded to provide a direct current output across said diode device whose value is determined by the variation in the value of the alternating current voltage supply from said selected voltage level.

6. The circuit of claim 5 wherein the alternating current voltage applied to said diode device is amplitude modulated by said modulation means with a slowly varying triangular voltage wave form.

7. The circuit of claim 6 wherein the alternating current voltage applied to said diode device is amplitude modulated by said modulation means with a direct current voltage.

8. The circuit of claim 5 wherein the means for controlling the point during each modulation cycle at which the peak current of said diode device is exceeded is a variable resistance.

References Cited in the file of this patent

UNITED STATES PATENTS

| | | |
|---|---|---|
| 2,752,559 | Lipkin | June 26, 1956 |
| 2,861,177 | Dishal et al. | Nov. 18, 1958 |
| 2,914,720 | Merkel | Nov. 24, 1959 |
| 2,975,377 | Price et al. | Mar. 14, 1961 |
| 2,986,724 | Jaeger | May 30, 1961 |